United States Patent
Tews et al.

(10) Patent No.: US 7,986,023 B2
(45) Date of Patent: *Jul. 26, 2011

(54) SEMICONDUCTOR DEVICE WITH INDUCTOR

(75) Inventors: Helmut Tews, Munich (DE); Hans-Gerd Jetten, Hoehenkirchen (DE); Hans-Joachim Barth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 198 days.

This patent is subject to a terminal disclaimer.

(21) Appl. No.: 11/856,089

(22) Filed: Sep. 17, 2007

(65) Prior Publication Data

US 2009/0072388 A1    Mar. 19, 2009

(51) Int. Cl.
*H01L 29/00* (2006.01)
*H05K 7/00* (2006.01)

(52) U.S. Cl. ............... 257/528; 257/E25.025; 361/760

(58) Field of Classification Search .................. 257/516, 257/528, 787, E25.025; 361/760–764, 767, 361/768, 776, 783
See application file for complete search history.

(56) References Cited

U.S. PATENT DOCUMENTS

| | | | | |
|---|---|---|---|---|
| 5,834,825 A * | 11/1998 | Imai | ............................... | 257/531 |
| 6,446,874 B1 | 9/2002 | Elbaz et al. | | |
| 7,227,240 B2 * | 6/2007 | Knapp et al. | .................. | 257/531 |
| 7,300,824 B2 * | 11/2007 | Sheats | ........................... | 438/126 |
| 7,498,656 B2 | 3/2009 | Zhang et al. | | |
| 2003/0116790 A1 | 6/2003 | Kikuchi et al. | | |
| 2004/0043533 A1 | 3/2004 | Chua et al. | | |
| 2006/0022277 A1 | 2/2006 | Kavalieros et al. | | |
| 2006/0181385 A1 * | 8/2006 | Hurley | ........................... | 336/200 |
| 2007/0076391 A1 * | 4/2007 | Hsu | ............................... | 361/763 |
| 2007/0284726 A1 | 12/2007 | Lin et al. | | |
| 2008/0308917 A1 | 12/2008 | Pressel et al. | | |
| 2009/0072411 A1 | 3/2009 | Tews et al. | | |

FOREIGN PATENT DOCUMENTS

DE        2005001828        5/2007

OTHER PUBLICATIONS

Hasan Sharifi, Tae-Young Choi, Saeed Mohammadi; Self-Aligned Wafer-Level Integration Technology With High-Density Interconnects and Embedded Passives; IEEE Transactions on Advanced Packaging; vol. 30, No. 1, Feb. 2007; pp. 11-18.

* cited by examiner

*Primary Examiner* — Jenny L. Wagner

(74) *Attorney, Agent, or Firm* — Infineon Technologies; Philip H. Schlazer

(57) ABSTRACT

One or more embodiments are directed to a semiconductor structure, comprising: a support; a semiconductor chip at least partially embedded within the support; and an inductor electrically coupled to the chip, at least a portion of the inductor overlying the support outside the lateral boundary of the chip.

24 Claims, 12 Drawing Sheets

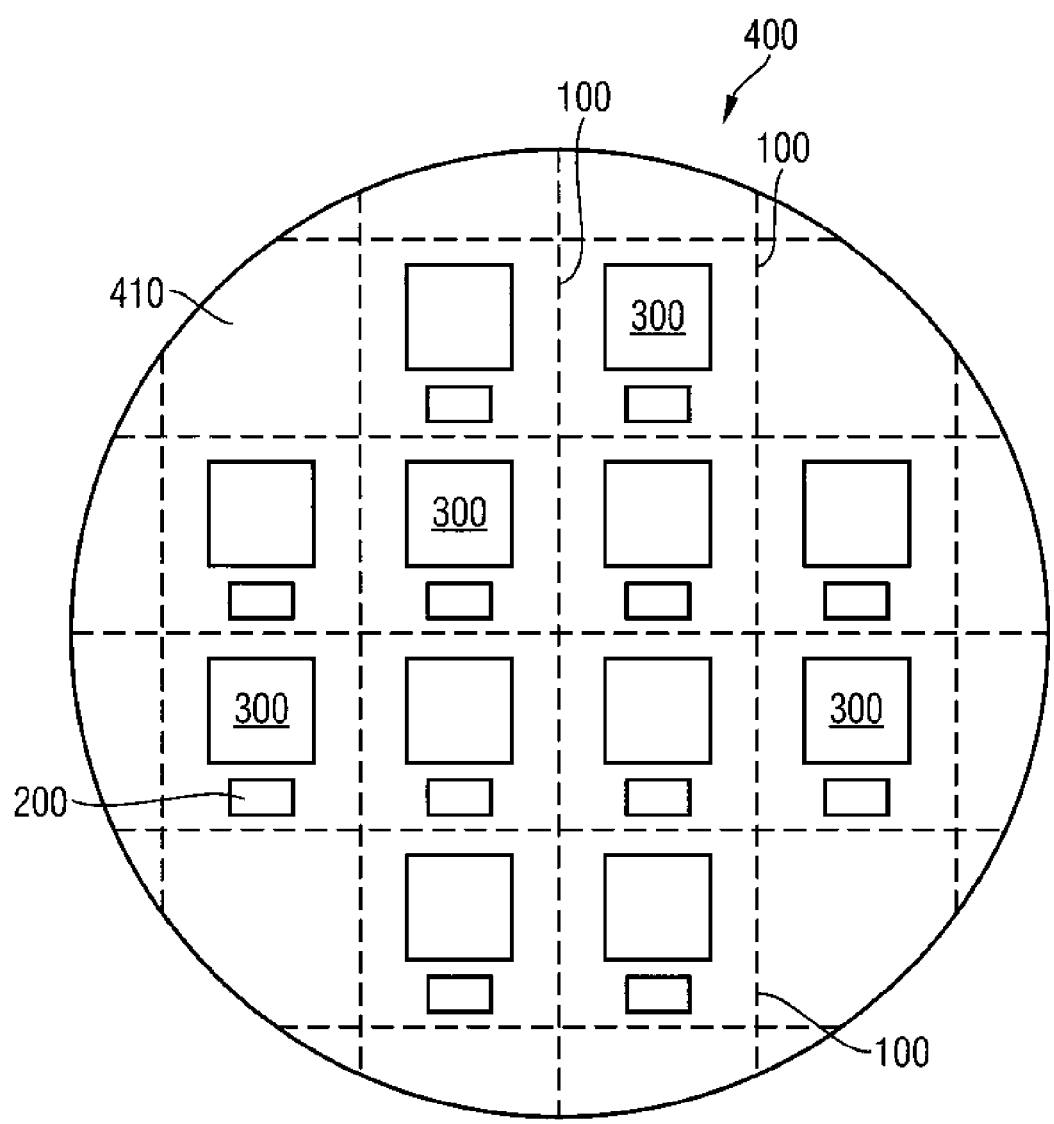

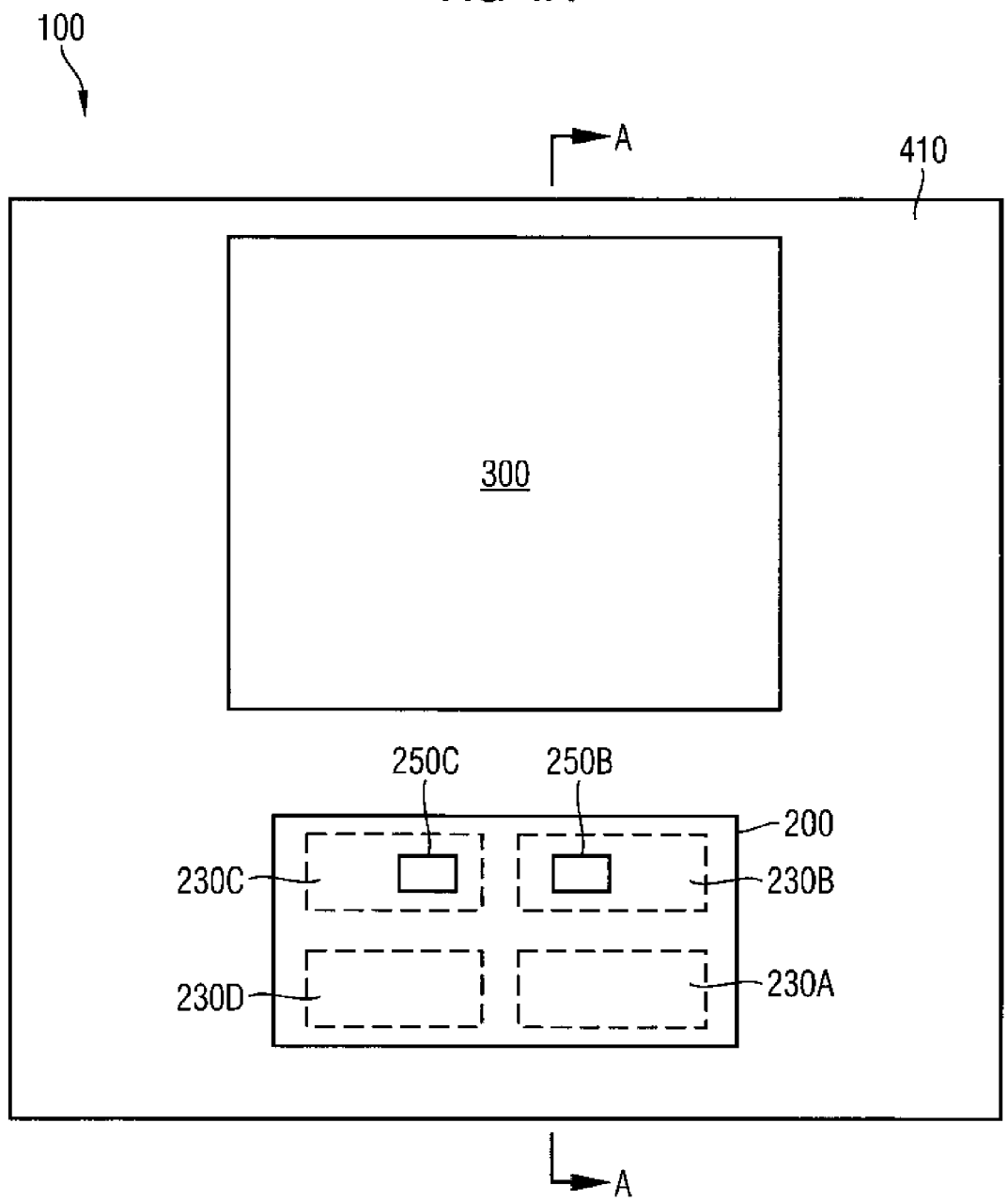

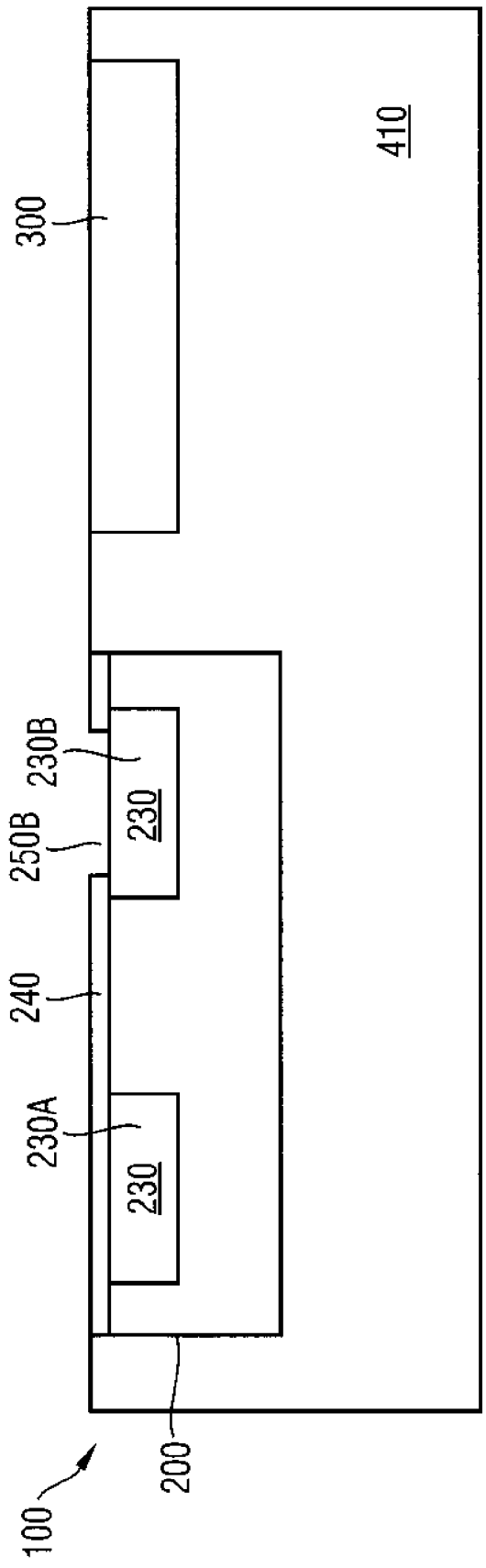

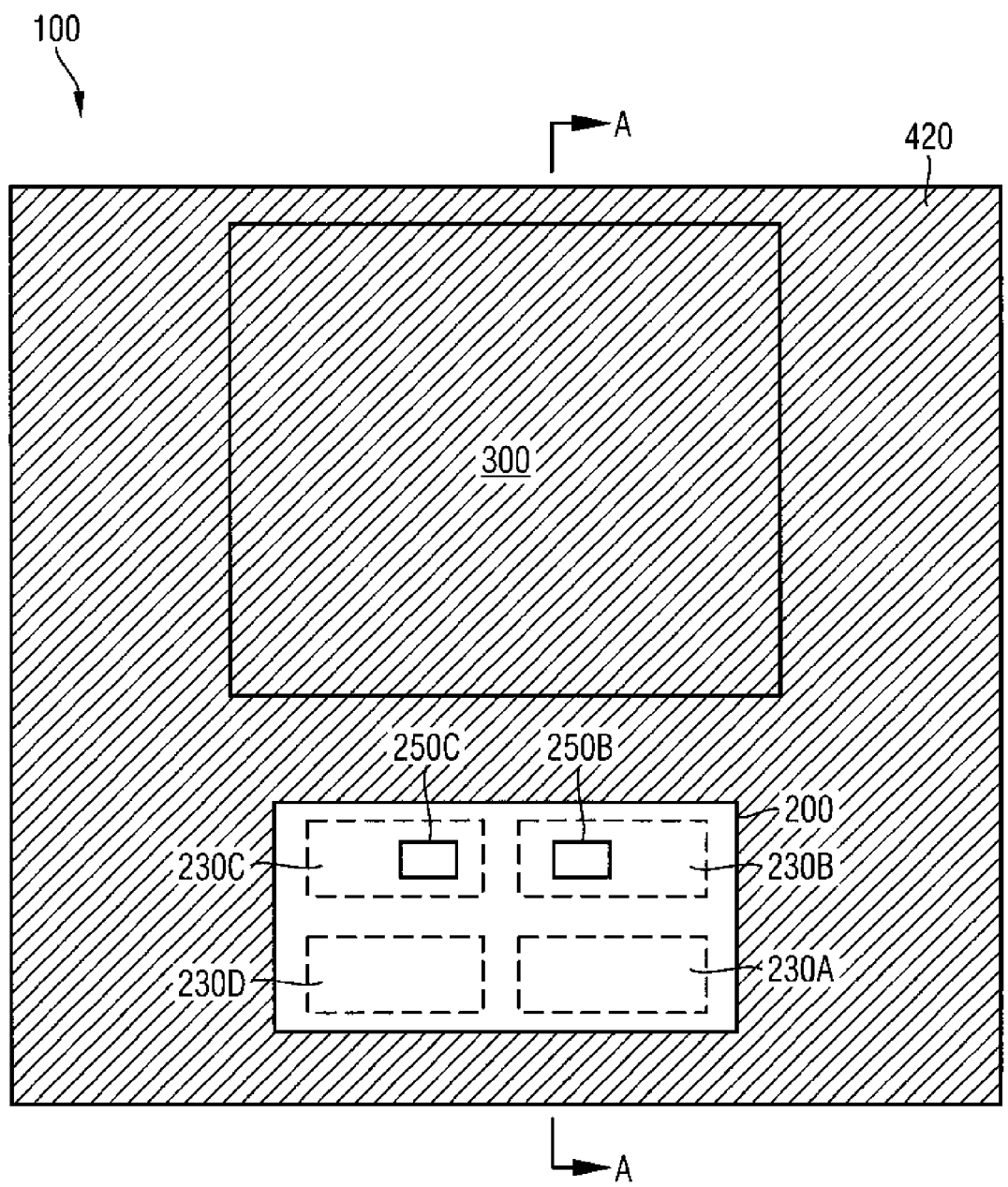

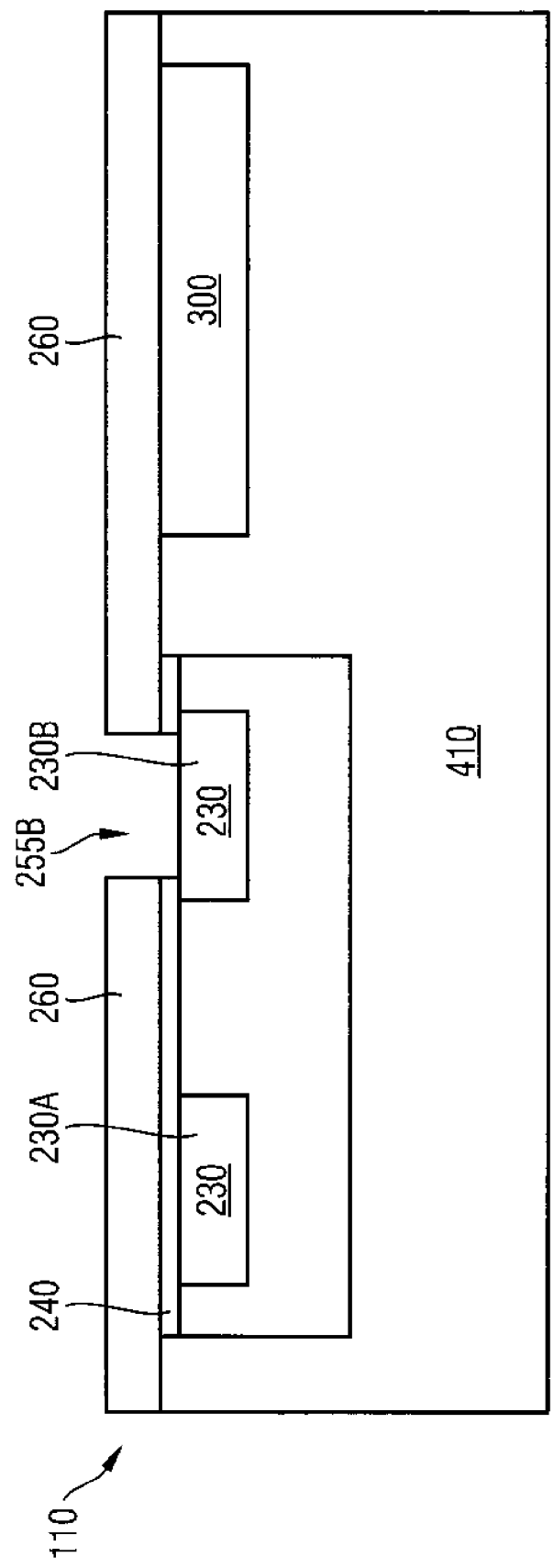

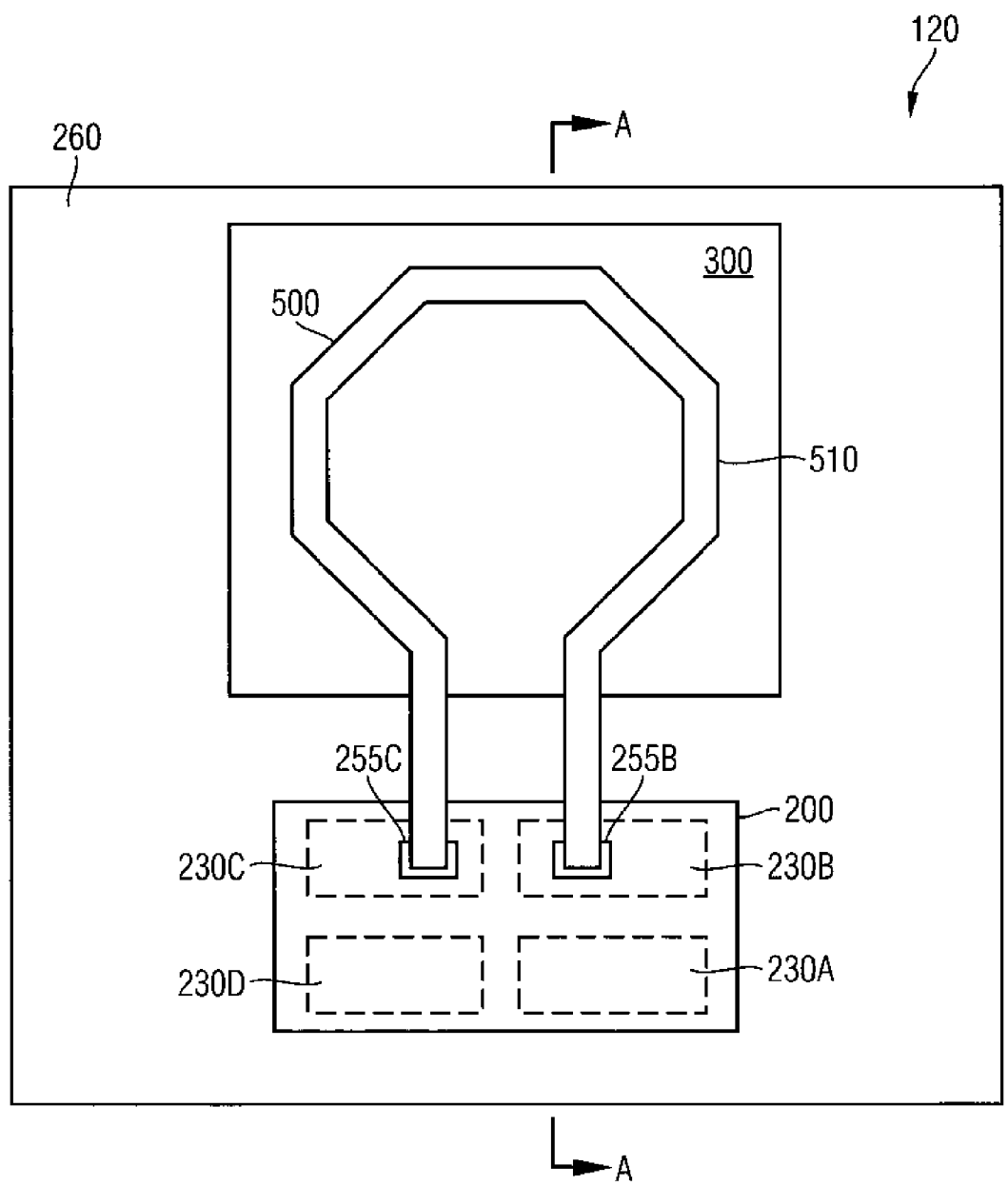

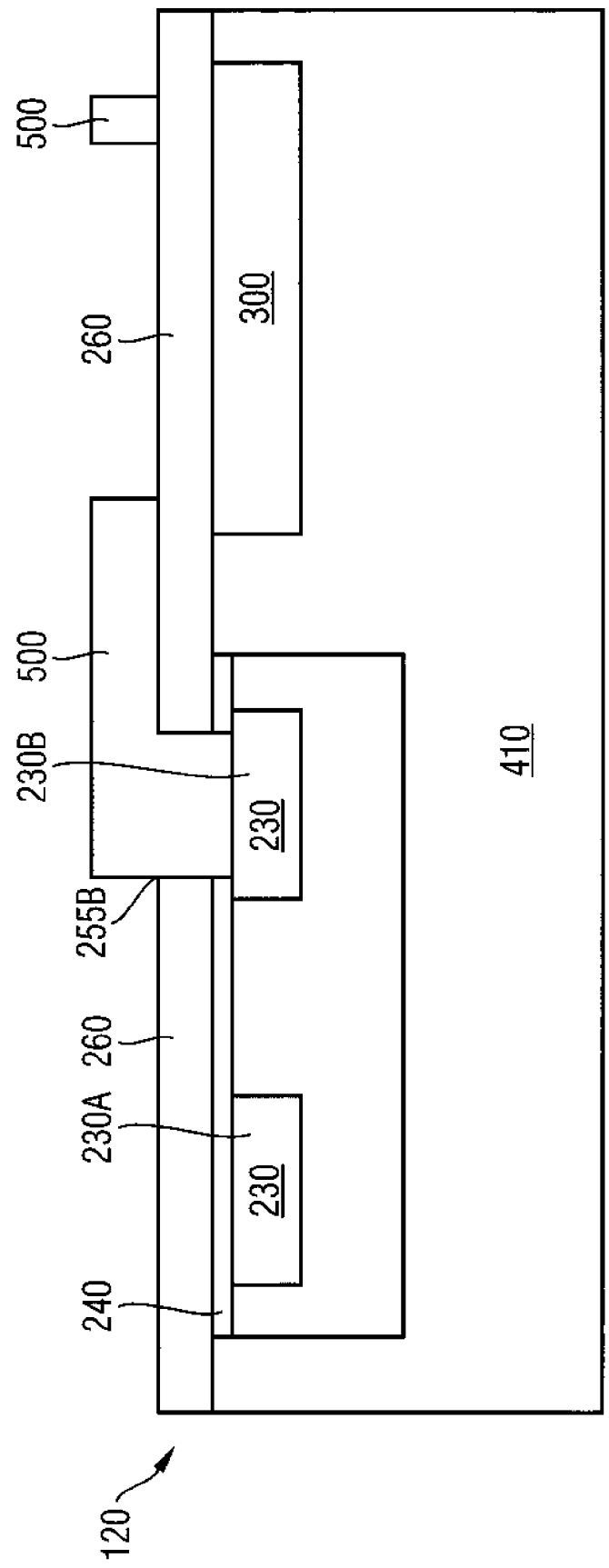

US 7,986,023 B2

SEMICONDUCTOR DEVICE WITH INDUCTOR

FIELD OF THE INVENTION

Generally, the present invention relates to semiconductor devices. More particularly, the present invention relates to semiconductor devices comprising inductors.

BACKGROUND OF THE INVENTION

The quality or Q factor of on-chip inductors may suffer from capacitive coupling with the silicon substrate and the Eddy currents induced in the silicon substrate. Therefore, inductors may be built in the higher metal levels in order to increase the distance of the inductor to the substrate. This may help to reduce capacitive coupling between the inductor and the substrate. However, the Q factor is still not optimal due to the capacitive coupling that still may exist with the chip substrate as well as the Eddy currents induced in the silicon. A new way of making inductors is needed.

SUMMARY OF THE INVENTION

An embodiment of the invention is a semiconductor structure, comprising: a support; a semiconductor chip at least partially embedded within the support; and an inductor electrically coupled to the chip, at least a portion of the inductor overlying the support outside the lateral boundary of the chip.

An embodiment of the invention is a semiconductor structure, comprising: a support; a semiconductor chip embedded within the support, the support having a portion outside the lateral boundary of the chip; and an inductor electrically coupled to the chip and overlying the support, at least a portion of the inductor disposed outside the lateral boundary of the chip.

An embodiment of the invention is a semiconductor structure, comprising: a support; a semiconductor die at least partially embedded within the support; and a magnetic region at least partially embedded within the support, the magnetic region laterally disposed from the chip.

An embodiment of the invention is a method of forming a semiconductor structure, comprising: forming a plurality of semiconductor chip on a first wafer; dicing the first wafer; at least partially embedding the plurality of chips within a support to form a reconfigured wafer; and forming a plurality of inductor coils, each of the inductor coils electrically coupled to a corresponding chip, at least a portion of the inductor coils overlying the support outside the lateral boundaries of the chips.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other.

FIG. 3A shows a top view of an embodiment of a reconfigured wafer;

FIG. 4A shows a top view of an embodiment of a semiconductor structure comprising a chip and a magnetic region;

FIG. 4B shows a cross sectional view of an embodiment of a semiconductor structure comprising a chip and a magnetic region;

FIG. 4C shows a top view of an embodiment of a semiconductor structure showing the fan-out region;

FIG. 5 shows a cross sectional view of an embodiment of a semiconductor structure comprising a chip and a magnetic region;

FIG. 6A shows a top view of an embodiment of a semiconductor structure comprising an inductor;

FIG. 6B shows a cross-sectional view of an embodiment of a semiconductor structure comprising an inductor;

DETAILED DESCRIPTION OF THE INVENTION

Figure 1:
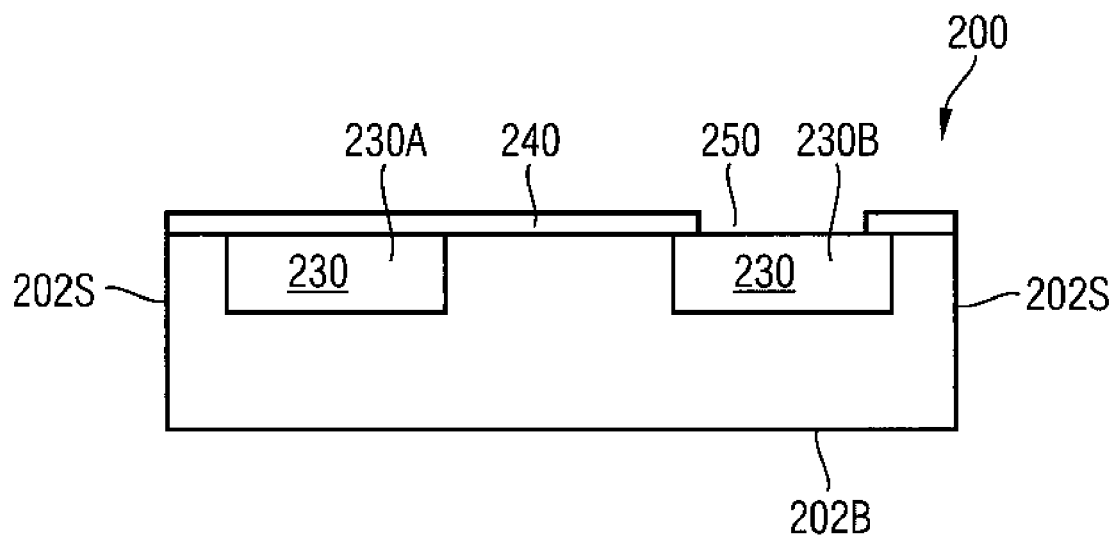
FIG. 1 shows an embodiment of a semiconductor chip.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. It is noted that as used herein, the term "or" does not mean exclusive or.

One or more embodiments of the present invention propose an inductor formed by the redistribution layer of a semiconductor device. The inductor may be formed in the fan-out region of the device. This may improve the Q factor of the inductor by reducing or eliminating chip substrate coupling and the Eddy currents. A magnetic material may, optionally, be disposed so as to underlie or overlie the inductor in order to increase the inductance.

FIGS. 4A,B illustrates a semiconductor structure 100 which is an embodiment of a semiconductor device of the present invention. FIG. 4A shows a top view of the structure 100 while FIG. 4B shows a cross section of structure 100 through AA. The structure 100 includes a semiconductor chip 200 which may also be referred to as a semiconductor die (while a plurality of chips may be referred to as dice). The structure 100 further includes a magnetic region 300 and a support 410. The support 410 may also be referred to as a support substrate or a support structure. The chip 200 and the magnetic region 300 are embedded within the support 410. A cross sectional view of the chip 200 is also shown in FIG. 1 while a cross sectional view of the magnetic region 300 is also shown in FIG. 2.

In the embodiment shown in FIGS. 4A,B, the chip 200 and the magnetic region 300 are embedded within the support 410 whereby the support 410 contacts the bottom and side surfaces of the chip 200 and the magnetic region 300 but not the top surface of either the chip or the magnetic region. In other embodiments of the invention, the chip 200 and/or the magnetic region 300 may be embedded within the support 410 such that the support 410 may be formed over at least a portion of the top surface of the chip 200 and/or at least a portion of the top surface of the magnetic region 300. Likewise, in other embodiments, the chip and the magnetic region may be embedded within the support 410 such that the support 410 contacts the sides of the chip and/or the sides of the magnetic region but not the top surface nor the bottom surface of the chip and/or the magnetic region. In one or more embodiments, it is also possible that the chips and/or the magnetic regions be embedded within the supported such that the top surface of the chip and/or the magnetic region sticks up from the top surface of the support 410.

In one or more embodiments, the chip and/or the magnetic region may be at least partially embedded within the support. In one or more embodiments, the chip and/or the magnetic region may be partially embedded within the support. In one or more embodiments, the chip and/or the magnetic region may be totally embedded within the support.

Figure 2:
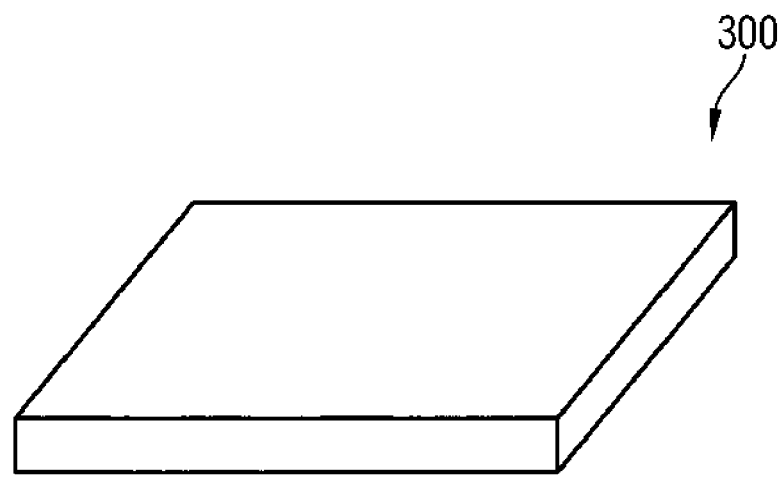
FIG. 2 shows an embodiment of a magnetic region.

Referring to FIG. 1, the semiconductor chip or die 200 includes a bottom surface 202B and side surfaces 202S. The side surfaces 202S of the chip or die may also be referred to as the edges of the chip or die. The chip 200 includes a top or active surface which is opposite the bottom surface 202B. The chip 200 further includes a final metal layer 230 proximate to the top surface. A passivation layer 240 is formed over the final metal layer.

While not shown, the chip 200 typically includes a substrate proximate its bottom surface. Likewise, the chip may further include additional metal layers, additional dielectric layers, components such as diodes and transistors, logic circuits, memory, logic, etc. The final metal layer 230 may be electrically coupled to the chip substrate and to the one or more devices that may be built in the chip substrate.

The final metal layer 230 may comprise any metallic material. The metallic material may be any pure metal or metal alloy. The final metal layer may include one or more elements such as Cu, Al, W, Au, or Ag. In one or more embodiments, the metallic material may comprise the element C (carbon). Examples of metallic materials which may be used include, not are not limited to, pure copper, copper alloy, pure aluminum, aluminum alloy, pure tungsten, tungsten alloy, pure silver, silver alloy, pure gold, and gold alloy. The final metal layer may also include barriers, liners or cap layers such as Ta, TaN, TaC, Ti, TiN, TiW, WN, WCN, CoWP, CoWB, NiMoP, Ru or combinations thereof.

The final metal layer may include at least one metal line which may be referred to herein as final metal lines. In one or more embodiments, the final metal layer includes at least two final metal lines. Each of the final metal lines of the final metal layer may be spacedly disposed from each other. Each of the final metal lines may be electrically isolated from each other. In the embodiment shown in FIGS. 4A,B, the final metal layer 230 includes at least a first final metal line 230A, a second final metal line 230B, a third final metal line 230C and a fourth final metal line 230D. In one or more embodiments, at least one of the final metal lines may include one or more bonding pads (also referred to as contact pads). In one or more embodiments, each of the final metal lines may include one or more bonding pads.

The thicknesses of the final metal lines are not limited to any particular thickness. In one or more embodiments, each of the final metal lines 230A-D may have a thickness which is greater than about 250 nm (nanometers). In one or more embodiments, each of the final metal lines 230A-D may have a thickness which is greater than about 500 nm (nanometers). In one or more embodiments, each of the final metal lines 230A-D may have a thickness which is greater than about 1000 nm (nanometers). The final metal lines may be electrically coupled to devices that are built within the chip substrate.

The passivation layer 240 may be formed of any dielectric material such as an oxide, a nitride, an imide, an oxynitride or combinations thereof. The passivation layer 240 may, for example, comprise one or more dielectric layers such as an oxide layer, a nitride layer, an oxynitride, an imide layer or combinations thereof. As an example, the passivation layer may comprise a nitride layer overlying an oxide layer overlying another nitride layer. As an example, the passivation layer may comprise a nitride layer overlying an oxide layer. As an example, the passivation layer may comprise an oxide layer overlying a nitride layer. As another example, the passivation layer may consist essentially of a nitride layer overlying an oxide layer overlying another nitride layer. In one or more embodiments, the passivation layer 240 may comprise a high-K dielectric material. A high-K dielectric material may have a dielectric constant greater than silicon dioxide. A high-K material may have a dielectric constant greater than 3.9.

In one embodiment, the thickness of the oxide layer and/or the thickness of the nitride layer may be less than about 1000 nm (nanometers). In one embodiment, the thickness of the oxide layer and/or the thickness of the nitride layer may be less than about 500 nm. In another embodiment, the thickness of the oxide layer and/or the thickness of the nitride layer may be less than about 250 nm. In another embodiment, the thickness of the oxide layer and/or the thickness of the nitride layer may be less than about 200 nm. In another embodiment, the thickness of the oxide layer and/or the thickness of the nitride layer may be less than about 150 nm. In another embodiment, the thickness of the oxide layer and/or the thickness of the nitride layer may be less than about 100 nm. In another embodiment, the thickness of the oxide layer and/or the thickness of the nitride layer may be greater than about 50 nm. In another embodiment, the thickness of the oxide layer and/or the thickness of the nitride layer may be greater than about 25 nm.

In one or more embodiments, the thickness of the passivation layer 240 may be less than about 1000 nm. In one or more embodiments, the thickness of the passivation layer 240 may be less than about 500 nm. In one or more embodiments, the thickness of the passivation layer 240 may be less than about 250 nm. In one or more embodiments, the thickness of the passivation layer 240 may be less than about 200 nm. In one or more embodiments, the thickness of the passivation layer 240 may be less than about 150 nm. In one or more embodiments, the thickness of the passivation layer 240 may be less than about 100 nm. In one or more embodiments, the thickness of the passivation layer 240 may be less than about 50 nm. In one or more embodiments, the thickness of the passivation layer 240 may be less than about 25 nm. In one or more embodiments, the thickness of the passivation layer 240 may be greater than about 10 nm. In one or more embodiments, the thickness of the passivation layer 240 may be greater than about 15 nm.

In the embodiment of the chip 200 shown in FIGS. 4A,B, openings 250B and 250C are formed through the passivation layer so as to expose the final metal line 230B and the final metal line 230C of the final metal layer 230. The openings 250B,C may be in the form of a hole and may be referred to as via openings. The openings 250B,C provide for future electrical coupling of the second metal line 230B and the third metal line 230C to, for example, a redistribution layer. The openings 250B and 250C may be formed by a wet etch process or a dry etch process. It is noted that the openings 250B and 250C are formed in the active or upper side of the semiconductor chip which is above the chip substrate.

While FIG. 1 shows a single semiconductor chip or die 200, a plurality of semiconductor chips or dice may be formed at the same time on a single semiconductor wafer. The semiconductor wafer may then be singulated or diced into individual semiconductor chips. Singulation or dicing may be done using a diamond saw or by using a laser (or by other means such as a chemical means). Referring to FIG. 2, a plurality of magnetic regions 300 (such as, for example, magnetic plates) may also be formed.

The magnetic region 300 may be formed of one or more magnetic materials. The magnetic material used for the magnetic layer may comprise one of more of the magnetic elements. The magnetic material may comprise a metal element. The magnetic material may comprise one or more of the elements cobalt, nickel, iron, gadolinium, or dysprosium. The magnetic material may comprise one or more of the rare earth metal elements. The magnetic material may comprise one or more of the elements Ce, Pr, Eu, Dy, Er, or Sm. The magnetic material may comprise a transition metal element. The magnetic material may comprise one or more of the elements titanium, chromium or manganese. The magnetic material may comprise an alloy or mixture comprising a magnetic element and a metal element. Examples of magnetic materials include, without limitation, CoZrTa, CoNbZr, FeCo, FeCoCr, FeNi. The magnetic material may consist essentially of a ferromagnetic material. The magnetic material may comprise a ferromagnetic material. The magnetic material may comprise an anti-ferromagnetic material. The magnetic material may comprise a paramagnetic material. The magnetic material may comprise a diamagnetic material. The magnetic material may be a mixture of a ferromagnetic material with a paramagnetic material and/or a diamagnetic material. The magnetic material may form a permanent magnet. The magnetic material may be magnetically hard.

It is noted that the magnetic region may take any form such as a plate, a wire, a coil, a bar, a powder, a film, etc. The region may be substantially planar or it may be non-planar. The shape of the magnetic region may be any shape and is not limited to any particular shape. Examples of possible shapes include, but are not limited to, rectangular, quadratic, circular, and ellipsoidal. The magnetic region may be formed of a plurality of spacedly disposed sub-regions. In one or more embodiments, the lateral footprint of the magnetic region may be larger than the lateral footprint of the chip. In one or more embodiments, the lateral footprint of the chip may be larger than the footprint of the magnetic region.

In one or more embodiments, the magnetic region may be in the form of a magnetic plate or a magnetic layer. The magnetic plate or magnetic layer may also be slotted or built out of individual non-contacting pieces. The magnetic plate or magnetic layer may be planar or non-planer. A magnetic plate or magnetic layer may consist of a sheet of a magnetic material or of a film of magnetic material (such as film may be disposed (for example, by sputtering PVD, evaporation CVD, ALD, electroplating, electro-less plating, etc) on its own support.

After forming individual semiconductor chips (such as shown in FIG. 1) and individual magnetic regions (such as shown in FIG. 2), the chips 200 as well as the magnetic regions are assembled together to form a reconfigured wafer. The reconfigured wafer may be formed by first doing a pre-assembly of at least one semiconductor chip 200 (as shown in FIG. 1) and at least one of the magnetic regions 300 (as shown in FIG. 2) together onto a carrier. In one or more embodiments, the reconfigured wafer may be formed by doing a pre-assembly of a plurality of semiconductor chips 200 and a plurality of the magnetic regions 300 together onto a carrier.

In one or more embodiments, the pre-assembly process places a plurality of individual semiconductor chips 200 in a regular fashion with a certain distance to each other. In one or more embodiments, this distance may be about 1 μm (micrometer or micron) to about several millimeter to each other. In one or more embodiments, the average distance between the chips on the reconfigured wafer may be greater than the average distance of the chips on the original wafer.

The pre-assembly process may be done by placing the chips face down (e.g. bottom side up) onto the surface of a carrier using a double sided adhesive tape. Next, one or more of the magnetic regions may be positioned on the carrier in the neighborhood of each of the chips also with the use of the tape. For example, one or more of the magnetic regions may be placed adjacent or proximate to a corresponding semiconductor chip. The exact placement of the magnetic regions relative to a corresponding chip may be at least partially determined by the desired location of the inductor discussed below. In one or more embodiments of the invention, the chips are placed face down onto the tape (the active or upper surface faces the tape). In one or more embodiments, the magnetic region may be positioned so it is laterally disposed from the chip. Being laterally disposed includes the embodiment that the magnetic region may laterally spacedly disposed from the chip so that there is some distance or space between the chip and the magnetic region. Being laterally disposed also includes the embodiment that the magnetic region actually touches the chip (e.g. there is no space between the magnetic region and the chip).

After placing the semiconductor chips 200 and the magnetic regions 300 onto a tape, the chips and regions may be embedded into a support structure. This may be done in various ways. For example, the tape, the chips and the magnetic regions may be placed within a molding chamber, which is then filled with a liquid molding compound. In one or more embodiments, the molding compound may comprise a dielectric material. In one or more embodiments, the molding compound may consist essentially of a dielectric material. The molding compound may one or more of a variety of materials such as a plastic, a polyimide, an epoxy based material or a BCB (Benzo-cyclo-butene). In one or more embodiments, the molding compound may have a low coefficient of thermal expansion (CTE) or a CTE that matches that of the semiconductor chip. The molding compound fills in the spaces between the chips and the assemblies and may additionally be poured to a level which is above the bottom surfaces of the chips and magnetic regions so that the molding compound contacts the sides as well as the bottom surfaces of the chips and magnetic regions. In one or more embodiments, it is possible that the molding compound is poured to a level below the bottom surface of the chips and/or the magnetic regions.

After a mold compound has been used, an application of heat and/or pressure may then be used to harden the molding compound and build a planar assembly of a molded wafer with the chips and magnetic regions fixed in a support substrate. The molded wafer may then be removed from the carrier plate and the tape may be peeled away from the molded reconfigured wafer. The molding compound forms the support for the reconfigured wafer. The support may also be referred to as the support substrate or the support structure. In one or more embodiments of the invention, the support may contact the side surfaces and the bottom surfaces of the chips and the magnetic regions. After the tape is removed, the top or active surfaces of the semiconductor chips, the magnetic regions and support substrate are revealed.

FIG. 3A shows a top view of an embodiment of a reconfigured wafer 400 that includes chips 200 and magnetic regions 300 embedded within a support substrate 410. The wafer 400 includes a plurality of structures 100. Each structure 100 represents an embodiment of an individual partially completed semiconductor device. Each of the structures 100 includes a semiconductor chip 200 and a magnetic region 300. In the embodiment shown in FIG. 3A, the distances between the chips 200 in the reconfigured wafer 400 are larger than they were when the chips were initially formed in the singulated wafer. In one or more embodiments, the average distance between the chips embedded within the reconfigured wafer is larger than the average distance between the chips in the original wafer.

Figure 3B:
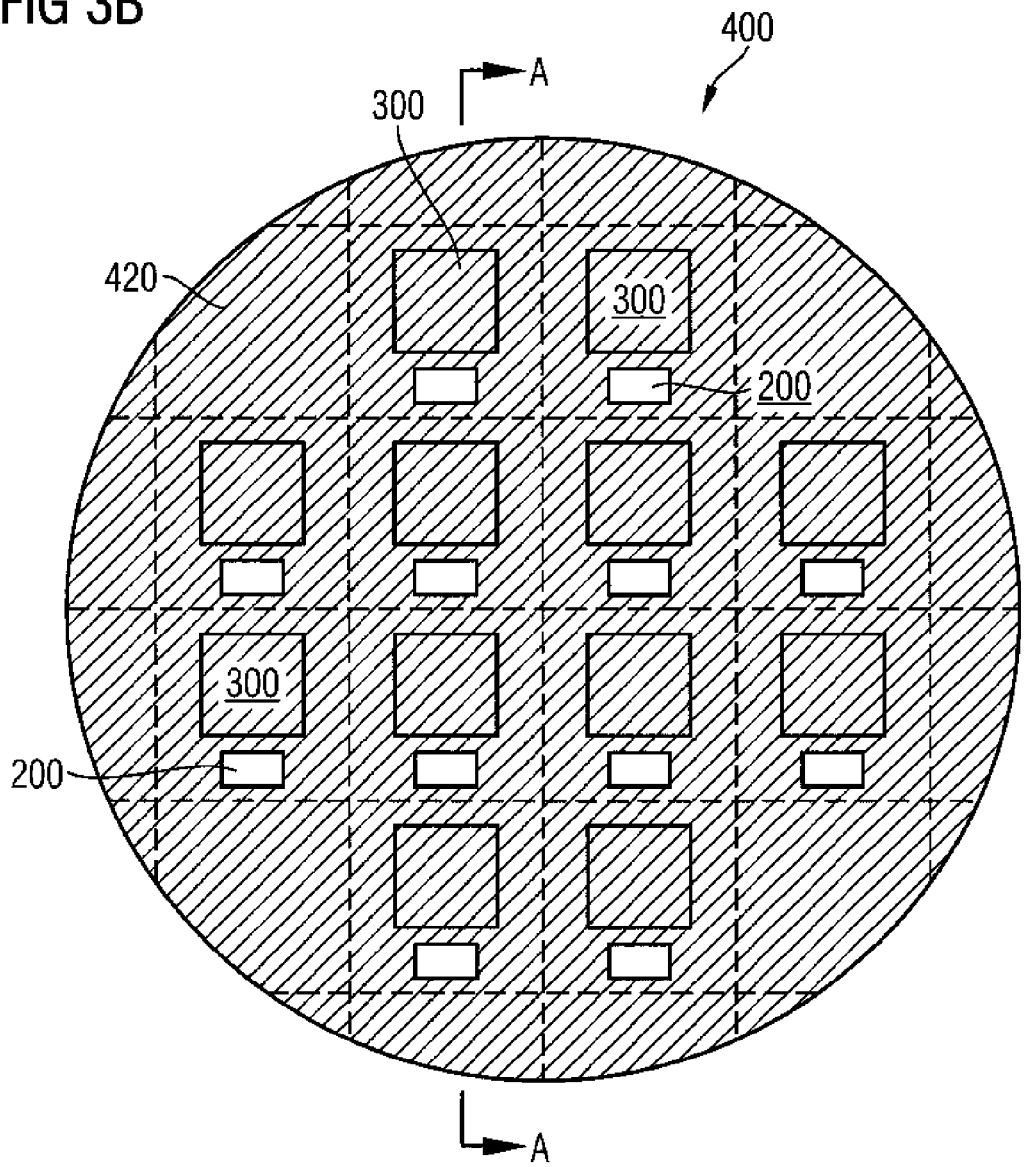
FIG. 3B shows a top view of an embodiment of a reconfigured wafer showing the fan-out region.
Figure 3C:
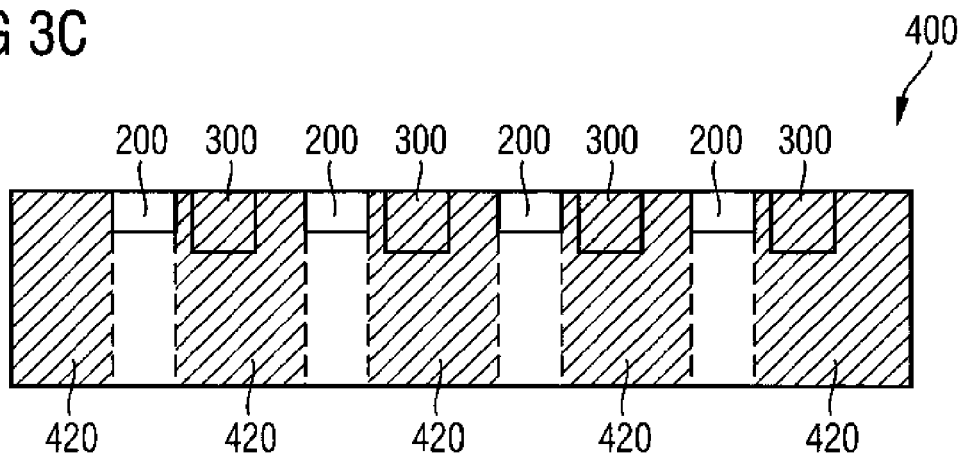
FIG. 3C shows a cross sectional view of a reconfigured wafer.

Referring to FIG. 3A, it is seen that the lateral dimensions of the reconfigured wafer 400 extend beyond the lateral dimensions of the chips 200. The portion of wafer 400 that is laterally outside the lateral boundaries of the chips 200 is referred to as the fan-out region of the reconfigured wafer 400. FIG. 3B shows a top view of the fan-out region 420 of the wafer 400. FIG. 3C shows a cross sectional view of the fan-out region of the wafer 400. From FIGS. 3B,C it is seen that the magnetic regions 300, being laterally displaced from the chips 200 are disposed in the fan-out region of the wafer 400. As noted above, in one or more embodiments, the magnetic regions may be laterally disposed from the chips. This includes the embodiment wherein the magnetic regions are laterally spacedly disposed from the chips (so there is some distance between the magnetic regions and the chips). This also includes the embodiment wherein the magnetic regions (such as magnetic plates) actually touch the chips.

FIGS. 4A,B show top and cross sectionals view of a structure 100 that includes a semiconductor chip 200 and a magnetic region 300 embedded in a support structure 410. It is understood that the structure 100 shown in FIGS. 4A-C represents a portion of the reconfigured wafer and that it represents one of a plurality of substantially identical structures 100 on the reconfigured wafer 400 shown in FIG. 3A.

Figure 4D:
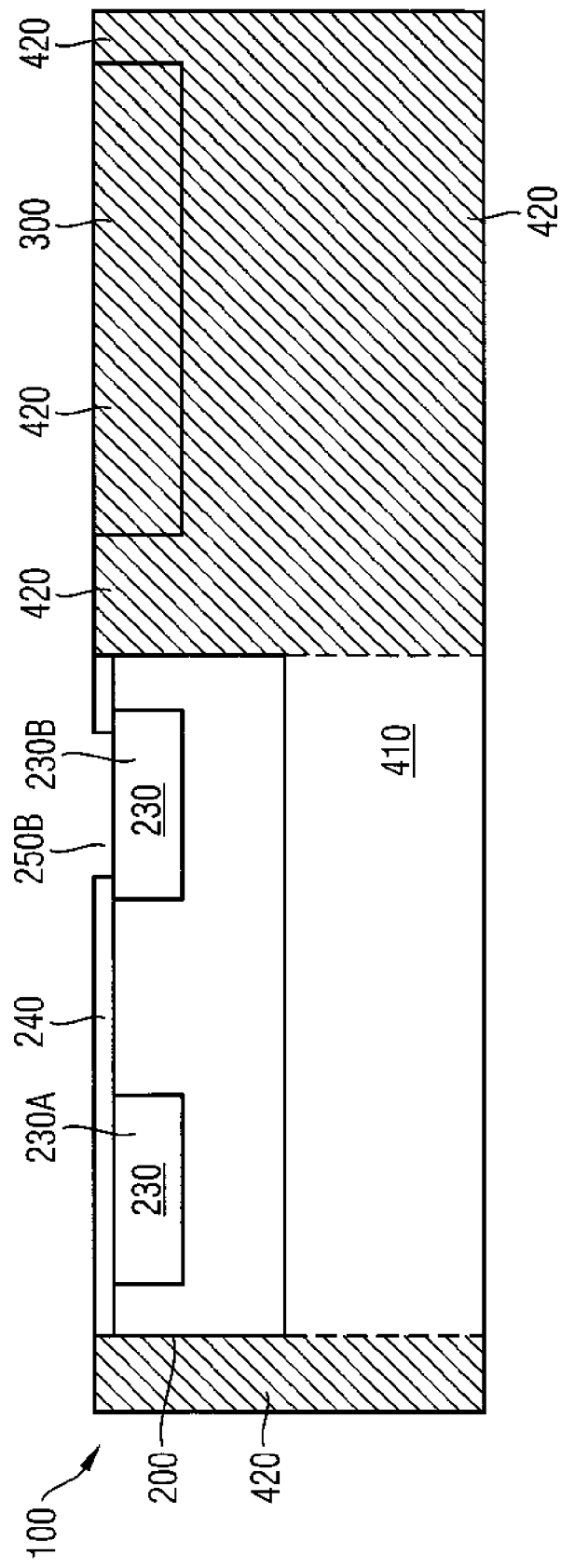
FIG. 4D shows a cross sectional view of a semiconductor structure showing the fan-out region.

Referring to FIGS. 4A,B it is seen that the lateral dimensions of the structure 100 extend beyond the lateral dimensions of the chip 200. The portion of device 100 that is laterally outside the lateral boundary of the chip 200 is referred to as the fan-out region of the structure 100. FIG. 4C shows a top view of the fan-out region 420 (the cross hatched area) of the device 100. FIG. 4D shows a cross sectional view of the fan-out region 420 of the structure 100. The fan-out region 420 is shown as the cross hatched area 420. From FIG. 4C,D, it is seen that the magnetic region 300, being laterally displaced from the chip 200 is disposed in the fan-out region of the structure 100.

Referring to FIG. 5, after the molded reconfigured wafer is formed, an additional dielectric (for example, an oxide, a nitride, an oxynitride, a polyimide, a BCB, etc) layer 260 may be deposited over the structure 100 to form the structure 110 of FIG. 5. Hence, an additional dielectric 260 may be formed over the passivation layer 240 and over the magnetic region 300. Openings 255B and 255C (where 255C can be seen in FIG. 6A) may be formed through the layer 260 to expose surfaces of the final metal lines 230A and 230B of chip 200. These exposed surfaces may be surfaces on contact pad regions of the final metal layer as well as contact pad regions of the conductive interconnect.

Referring to FIGS. 6A,B, (with FIG. 6A being a top view and FIG. 6B being a corresponding cross sectional view through AA), a conductive layer 500 is formed over the structure 110 from FIG. 5 to form the structure 120 in FIGS. 6A,B. The conductive layer 500 may be part of a redistribution layer. Generally, a redistribution layer may be formed as one or more conductive pathways. In one or more embodiments, the redistribution layer may include two or more conductive pathways. The two or more of the conductive pathways may be spacedly disposed from each other. The two or more of the conductive pathways may be electrically isolated from each other. Hence, the redistribution layer need not be formed as a single continuous conductive pathway. Each of the conductive pathways may have any shape. For example, they may be straight or curved. They may be star shaped (for example, fingers radiating from a central location). The one or more conductive pathways of the redistribution layer may be formed as conductive lines.

Generally, the redistribution layer may be formed of any conductive material. In one or more embodiments, the redistribution layer may be formed of a metallic material. The metallic material may be a pure metal or a metal alloy. The metallic material may include one or more of the elements Co, Al, W, Ag or Au. In one or more embodiments, the metallic material may include the element C (carbon).

The redistribution layer may also include metallic barriers or liners such as Ta, TaN, Ti, TiN, TiW, WN, WCN, CoWP, CoWB, NiMoP, V, Pd, Cr, Pt, R or combination thereof. In one or more embodiments, the redistribution layer may be formed of a non-metallic material such as a doped polysilicon or a conductive polymer. The redistribution layer is not limited to any particular thickness. The redistribution layer may, for example, be one or more microns thick and/or one or more microns wide.

The redistribution layer may, for example be useful for distributing electrical signals and electrical energy to various portions of the semiconductor structure. The electrical signals may be in the form of electrical current or voltage. For example, in one or more embodiments, the redistribution layer may redistribute electrical signals from the final metal layer to other positions of the device that overlie the semiconductor chip. Likewise, in one or more embodiments, the redistribution layer may redistribute the electrical signals from the final metal layer to points which are laterally outside the lateral boundary of the chip. Hence, the redistribution layer may extend beyond the lateral boundary of the chip. In one or more embodiments, the at least a portion of the redistribution layer may extend into the fan-out region of the structure, wafer or device.

In one or more embodiments of the invention, conductive balls (such as, for example, metallic balls or solder balls) may be electrically coupled to the conductive pathways of the redistribution layer (for example, to one or more of the termination points). One or more conductive balls may overlie the chip while one or more conductive balls may overlie positions which are outside the lateral boundary of the chip and may thus be in the fan-out region of the structure or device. The conductive balls may be used to electrically couple the device package to a printed circuit board.

In the semiconductor structure 120 shown in FIGS. 6A,B, the redistribution layer 500 comprises a conductive pathway 500. At least a portion of the conductive pathway 500 is shaped to form a coil 510. The coil 510 forms an inductive element or inductor. In the embodiment shown, the coil 510 is shaped as a loop, hence, the corresponding inductor may be referred to as a loop inductor. It is thus seen that the redistribution layer 500 may be shaped to form an inductor 510. One end of the inductor 510 is electrically coupled to the second final metal line 230B while the other end of the inductor 510 is electrically coupled to third final metal line 230C. In one or more embodiments, one or more of the final metal lines may be electrically coupled to the same or to different devices in the chip substrate. In one or more embodiments, each of the final metal lines may be electrically coupled to the same or to different devices in the chip substrate.

In the embodiment shown in FIGS. 6A,B, the magnetic region is laterally sized so that essential all of the inductor coil 510 overlies the magnetic region. However, in other embodiments, the inductor and magnetic region may be relatively sized or positioned so that only a portion of the inductor 510 overlies the magnetic region. Hence, the inductor may be disposed so that at least a portion of the inductor overlies the magnetic region 300.

It is noted that the inductor 510 is disposed outside the lateral boundary of chip 200 and is disposed within the fan-out region of the structure 120. In the embodiment shown, the inductor coil 510 is completely outside the lateral boundary of the chip and thus completely within the fan-out region of the structure 120. However, in other embodiments, it is also possible that the inductor is only partially within the fan-out region of the structure 120.

Figure 7A:
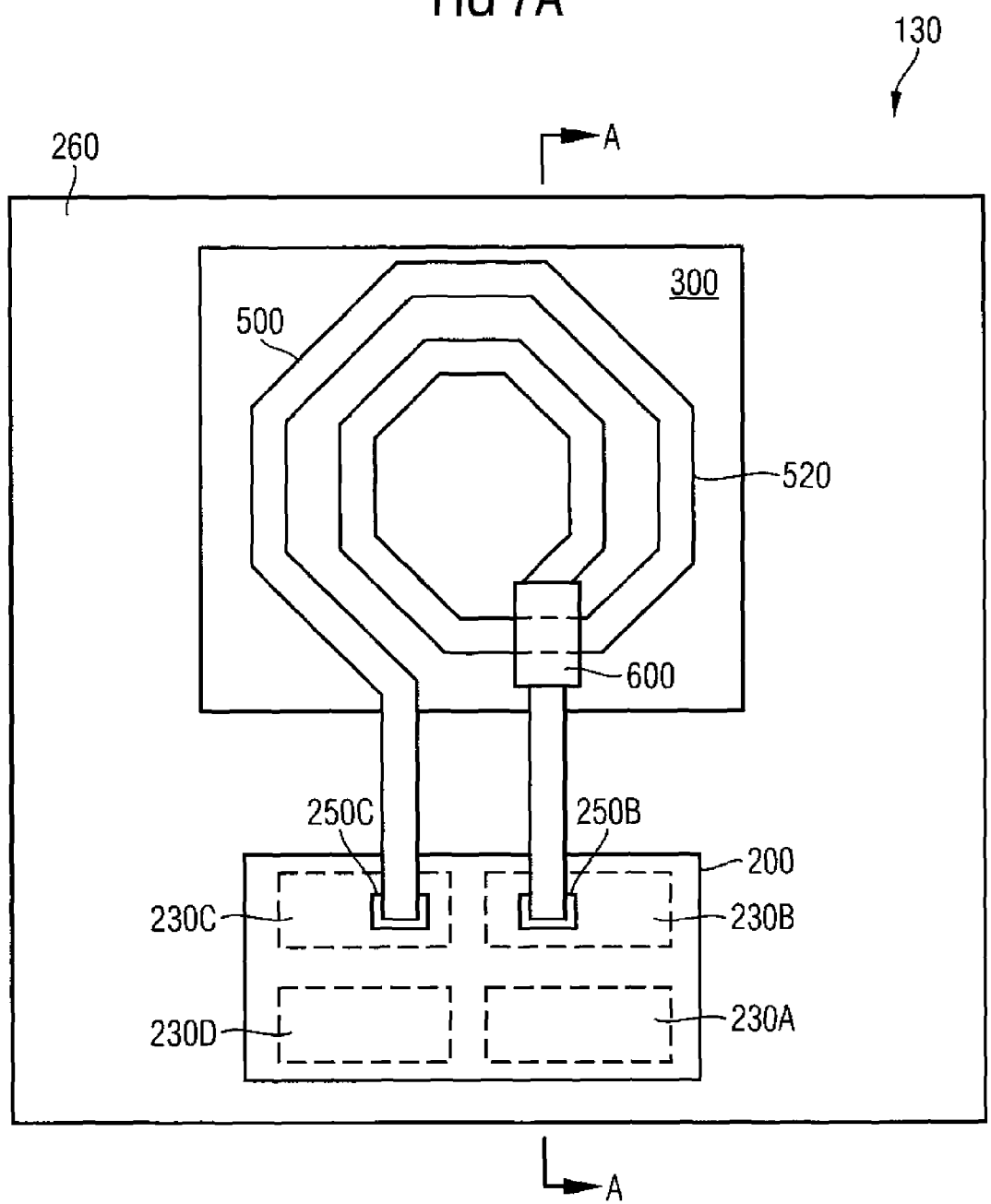
FIG. 7A show a top view of an embodiment of a semiconductor structure comprising an inductor.
Figure 7B:
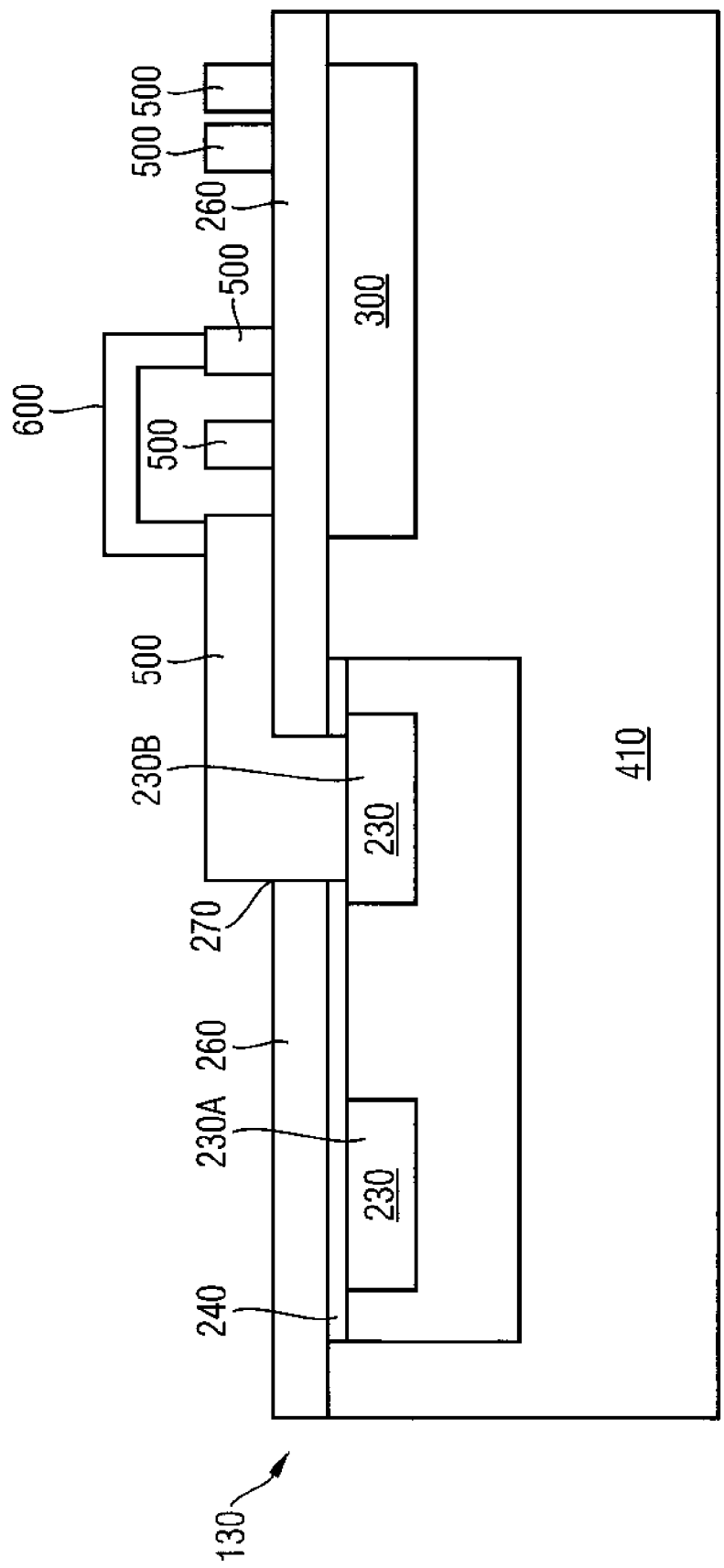
FIG. 7B shows a cross sectional view of a semiconductor structure comprising an inductor.

Another embodiment of the invention is shown as the structure 130 in FIGS. 7A,B. FIG. 7B is a cross sectional view through AA of the structure 130 shown in FIG. 7A. This embodiment also includes a redistribution layer 500. In this embodiment, the redistribution layer 500 is also shaped to form a coil 520. In this case, the coil 520 is in the shape of a spiral. The coil 520 also forms an inductive element or inductor. In this case, the inductor 520 may be referred to as a spiral inductor. In the embodiment shown, essentially all of the inductor 520 overlies the magnetic region 300. However, in other embodiments, the inductor coil 520 may only partially overlie the magnetic region. In the embodiment shown, the inductor 520 is completely within the fan-out region of the structure 130. However, in other embodiments, the inductor 520 may only partially be disposed within the fan-out region of the structure 130. It is noted that the redistribution layer may be shaped to form any spiral shaped coil such as, for example, octagon spiral, square spiral or circular spiral.

A spiral inductor (such as the one shown in FIG. 7A,B) may have a higher inductance compared to a single loop inductor coil (such as the one shown in FIGS. 6A,B). However, the manufacturing process may be more complex.

In order to form the spiral shape to the inductor coil 520 shown in FIGS. 7A,B, a conductive interconnect 600 may be used to electrically couple a first conductive pathway 500A of redistribution layer 500 to a second conductive pathway 500B of the redistribution layer 500. In the embodiment shown in FIG. 7A, the first conductive pathway 500A has one end electrically coupled to the final metal line 230B through opening 255B. The other end of the first conductive pathway is electrically coupled to the interconnect 600. The second conductive pathway 500B has one end electrically coupled to the final metal line 230C through opening 255C and the other end electrically coupled to the interconnect 600.

In the embodiment shown in FIGS. 7A and 7B, the interconnect 600 is an overpass such that a portion of the second conductive pathway 500B crosses below the conductive interconnect 600. As a conductive overpass, the conductive interconnect 600 may, for example, be formed as part of a second higher level redistribution layer formed above the redistribution layer 500 and formed above the inductor 520.

In another embodiment of the invention, it is possible that the conductive interconnect 600 be formed as an underpass so that a portion of the inductor coil 520 (such as a portion of the second conductive pathway 520B) can cross above it. To form the conductive interconnect as an underpass, the conductive interconnect may, for example, be disposed in the dielectric layer 260 shown in FIG. 7B. In another embodiment, it is possible that the conductive interconnect be disposed in the support 410. It yet another embodiment it is possible that the inductor coil be formed from a higher level redistribution layer while the conductive interconnect be formed as part of a lower level redistribution layer (such that the high level redistribution layer is above the lower level redistribution layer).

The conductive interconnect may be formed of any conductive material. In one or more embodiments, it may be formed of a metallic material. For example, the metallic material may include one or more elements Cu, Al, W, and Ag. The metallic material may, for example, be a pure metal or a metal alloy.

It is noted that inductors (such as the loop inductor 510 shown in FIGS. 6A,B and spiral inductor 520 shown in FIG. 7A,B) which are at least partially within the fan-out region of the structure and thus not totally formed over the semiconductor chip itself) may have a higher Q factor because they are built outside of the semiconductor chip. There may, for example, be lower Eddy currents and less capacitive coupling to a silicon substrate with lower parasitic losses. In addition, placement of a magnetic material proximate to an inductor (such as over or under the inductor) may also increase the Q factor. The magnetic material may also increase the inductance L of the inductor. Hence, for a given inductance, it is possible that the lateral footprint of the inductor may be reduced. This may, in turn, decrease the resistance and capacitance of the inductor.

Referring to FIGS. 6A and 7A, the lateral dimension of magnetic region 300 it not limited to any particular dimension. In one or more embodiments, it may range from at least one $\mu m^2$ (square microns) to several $mm^2$ (square millimeters) depending on the size of the respective inductor coil. In one or more embodiments, the lateral footprint of the magnetic region may be larger than the lateral footprint of the inductor coil (for example, either loop coil or spiral coil). In one or more embodiments, the lateral footprint of the magnetic region may be smaller than the lateral footprint of the inductor coil (for example, either loop coil or spiral coil). In one or more embodiments, the lateral footprint of the magnetic region may be larger than the lateral footprint chip. In one or more embodiments, the lateral footprint of the magnetic region may smaller than the lateral footprint of the chip.

In one or more embodiments, a magnetic region may be placed above the inductor coil rather than underneath the inductor coil. In one or more embodiments, the magnetic region may be placed both underneath the inductor coil as well as over the inductor coil.

It is noted that in one or more embodiments of the invention, the redistribution layer may be used solely for forming one or more inductors. In one or more embodiments, it is possible that only part of the redistribution layer be used to form one or more inductors while a remaining part of the redistribution layer be used to distribute electrical signals (such as voltages and currents) to, optionally, conductive balls (such as solder balls). One or more of the conductive balls may overlie the chip while one or more of the conductive balls may overlie the fan-out region.

In one or more embodiments of the invention, it is possible to form an inductor without the use of the magnetic region. For examples, referring to FIGS. 6A,B, it is possible to form the loop inductor 510 without the magnetic region 300. Likewise, referring to FIGS. 7A,B, it is possible to form the spiral inductor 520 without the magnetic region 300. In one or more embodiments, an inductor may be formed at least partially within the fan-out region of a device without a magnetic region.

Referring to FIG. 6A, it is noted that a reconfigured wafer may comprise a plurality of structures 120. In one or more embodiments, in a downstream processing step, the reconfigured wafer may be singulated to form a plurality of individual structures or devices.

Likewise, referring to FIG. 7A, a reconfigured wafer may comprise a plurality of structures 130. In one or more embodiments, in a downstream processing step, the reconfigured wafer may be singulated to form a plurality of individual structures or devices.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor structure, comprising:
   a support;
   a semiconductor chip at least partially embedded within said support;
   an inductor electrically coupled to said chip, at least a portion of said inductor overlying said support outside the lateral boundary of said chip; and
   a magnetic region at least partially embedded within said support, said magnetic region laterally disposed from said chip, said magnetic region at least partially underlying said inductor.

2. The structure of claim 1, wherein essentially all of said inductor overlies said support outside the lateral boundary of said chip.

3. The structure of claim 1, wherein said inductor is a loop inductor.

4. The structure of claim 1, wherein said inductor is a spiral inductor.

5. The structure of claim 1, wherein said inductor comprises a metallic material.

6. The structure of claim 1, wherein said magnetic region comprises a ferromagnetic material.

7. The structure of claim 1, wherein said inductor includes at least a portion of at least one redistribution layer.

8. The structure of claim 1, wherein said support comprises a mold compound.

9. The structure of claim 1, wherein essentially all of said inductor overlies said magnetic region.

10. The structure of claim 1, wherein a top surface of said magnetic region is coplanar with a top surface of said support.

11. The structure of claim 1, wherein said inductor is in direct contact with said magnetic region.

12. The structure of claim 1, wherein said magnetic region is a magnetic plate.

13. A semiconductor structure, comprising:
    a support;
    a semiconductor chip at least partially embedded within said support;
    an inductor electrically coupled to said chip, at least a portion of said inductor overlying said support outside the lateral boundary of said chip; and
    a magnetic region at least partially embedded within said support outside the lateral boundary of said chip, said magnetic region at least partially underlying said inductor.

14. The structure of claim 13, wherein essentially all of said inductor overlies said support outside the lateral boundary of said chip.

15. The structure of claim 13, wherein said inductor is a loop inductor.

16. The structure of claim 13, wherein said inductor is a spiral inductor.

17. The structure of claim 13, wherein said inductor comprises a metallic material.

18. The structure of claim 13, wherein said magnetic region comprises a ferromagnetic material.

19. The structure of claim 13, wherein said inductor includes at least a portion of at least one redistribution layer.

20. The structure of claim 13, wherein said support comprises a mold compound.

21. The structure of claim 13, wherein a top surface of said magnetic region is coplanar with a top surface of said support.

22. The structure of claim 13, wherein said inductor is in direct contact with said magnetic region.

23. The structure of claim 13, wherein essentially all of said inductor overlies said magnetic region.

24. The structure of claim 13, wherein said magnetic region is a magnetic plate.

* * * * *